(12) United States Patent
Sicard

(10) Patent No.: US 7,538,586 B2
(45) Date of Patent: May 26, 2009

(54) TRANSMITTER FOR A CONTROLLED-SHAPE SWITCHED SIGNAL ON A COMMUNICATION LINE

(75) Inventor: Thierry Sicard, Tournefeuille (FR)

(73) Assignee: Freescale Semiconductor, Inc., Austin, TX (US)

(*) Notice: Subject to any disclaimer, the term of this patent is extended or adjusted under 35 U.S.C. 154(b) by 308 days.

(21) Appl. No.: 10/531,757

(22) PCT Filed: Oct. 8, 2003

(86) PCT No.: PCT/EP03/50705

§ 371 (c)(1),
(2), (4) Date: Apr. 14, 2005

(87) PCT Pub. No.: WO2004/040758

PCT Pub. Date: May 13, 2004

(65) Prior Publication Data

US 2006/0017474 A1  Jan. 26, 2006

(30) Foreign Application Priority Data

Oct. 31, 2002  (EP) ................. 02292729

(51) Int. Cl.
*H03B 1/00* (2006.01)

(52) U.S. Cl. ............... 327/108; 327/134; 327/137; 327/170

(58) Field of Classification Search ............. None
See application file for complete search history.

(56) References Cited

U.S. PATENT DOCUMENTS

| | | | | |
|---|---|---|---|---|
| 4,686,432 A | * | 8/1987 | Berland et al. | 315/403 |
| 5,606,296 A | | 2/1997 | Seong | |
| 5,828,245 A | * | 10/1998 | Brambilla et al. | 327/108 |
| 6,169,433 B1 | | 1/2001 | Farrenkopf | |
| 6,384,645 B2 | | 5/2002 | Cleris | |
| 6,448,752 B1 | * | 9/2002 | Umemoto | 323/288 |
| 2004/0150439 A1 | * | 8/2004 | Greenfeld | 327/131 |

* cited by examiner

Primary Examiner—Tuan Lam

(57) ABSTRACT

The transmitter comprises a signal generator including a capacitor producing the switched signal to be applied to the line. The capacitor is charged by a charging current in response to an input signal so as to define an edge of the switched signal through a feedback loop responsive to the capacitor voltage generating a feedback current having a continuous magnitude that is a progressive function of the capacitor voltage, the charging current being a function of the feedback current. The feedback loop generates first and second feedback voltages one of which is a rising function of the capacitor voltage and the other is a falling function of the capacitor voltage. The feedback current is generated first as a function of one of the feedback voltages and subsequently as a function of the other of the feedback voltages.

12 Claims, 3 Drawing Sheets

TRANSMITTER FOR A CONTROLLED-SHAPE SWITCHED SIGNAL ON A COMMUNICATION LINE

FIELD OF THE INVENTION

This invention relates to a transmitter for a controlled-shape switched signal on a communication line.

BACKGROUND OF THE INVENTION

Local networks often make use of a communication line, such as a communication bus, over which a set of nodes communicates. A driver module in a master node applies power to the line, the driver module being switched to produce step changes in the power in the line to transmit signals to receivers in remote slave nodes over the line. The switched power signal activates the multiplexed remote nodes connected to the line and the line also selectively transmits signals from the remote nodes back to a central processing unit.

Such a bus is used in automotive vehicles, for example, the bus comprising either a single line or a twisted pair of conductors in which the current flows, the close coupling between the pair of conductors reducing their sensitivity to electromagnetic interference ('EMI'), that is to say reception of noise induced in the wires of the bus, and improving their electromagnetic compatibility ('EMC'), that is to say the radiation of parasitic fields by the currents flowing in the wires of the bus; both are critical parameters, especially in automotive applications.

Historically, in automotive applications, functions such as door locks, seat positions, electric mirrors, and window operations have been controlled directly by electrical direct current delivered by wires and switches. Such functions may today be controlled by ECUs (Electronic Control Units) together with sensors and actuators in a multiplexed Controller Area Network (CAN). The Controller Area Network (CAN) standard (ISO 11898) allows data to be transmitted by switching a voltage, at a frequency of 250 kbauds to 1 Mbaud for example, to the multiplexed receiver modules over the twisted pair cable. The receiver modules may be actuators that perform a function, for example by generating mechanical power required, or sensors that respond to activation by making measurements and transmitting the results back to the ECU over the bus.

The CAN bus was designed to be used as a vehicle serial data bus, and satisfies the demands of real-time processing, reliable operation in a vehicle's EMI environment, is cost-effective, and provides a reasonable data bandwidth. However, connecting with the main body network directly via a CAN bus system can be expensive because of increased costs per node and because high overall network traffic can make management extremely difficult. To help reduce costs, the logical extension is to structure the network hierarchically.

A variant on the CAN standard is the LIN (Local Interconnect Network) sub-bus standard (see ISO 7498), which is an extension to the CAN bus, at lower speed and on a single wire bus, to provide connection to local network clusters. A LIN sub-bus system uses a single-wire implementation (enhanced ISO9141), which can significantly reduce manufacturing and component costs. Component costs are further reduced by self-synchronization, without crystal or ceramics resonator, in the slave node. The system is based on common Universal asynchronous receiver and transmitter serial communications interface (UART/SCI) hardware that is shared by most micro-controllers, for a more flexible, lower-cost silicon implementation.

It is often necessary to control accurately the shape of the leading and/or trailing edges of switched signals transmitted over the communication line. This is particularly the case where it is desired to minimise electromagnetic interference, by limiting the basic frequencies of electromagnetic emissions to certain acceptable frequency ranges and restricting the amplitudes of emissions of harmonics of the basic frequencies outside the acceptable range.

It is possible to generate signals to be transmitted with controlled shape by generating a step function current charging a capacitor to approximate the desired shape of the voltage signal, as shown in FIG. 1. Such a generator is readily accommodated in an integrated circuit using digital techniques. However, the discontinuous changes in the charging current produce large rates of change of the voltage across the capacitor and applied to the communication line, which are a source of EMI harmonics. Also, the capacitor stage has high impedance, with correspondingly low current produced by this stage, so that several follower stages are needed and its components are subjected to the full voltage swings across the capacitor, so that they need to withstand such relatively high voltages.

It is possible to generate signals to be transmitted with controlled shape by analogue circuits, such as those described in U.S. Pat. Nos. 5,530,388, 6,072,340 and 6,259,303, for example. However, the circuits described in these specifications do not give an optimal compromise between the requirements of low EMI and low circuit complexity, especially in the context of an integrated circuit implementation.

SUMMARY OF THE INVENTION

The present invention provides a transmitter for a controlled-shape switched signal on a communication line as described in the accompanying claims.

DETAILED DESCRIPTION OF THE PREFERRED EMBODIMENTS

Figure 1:
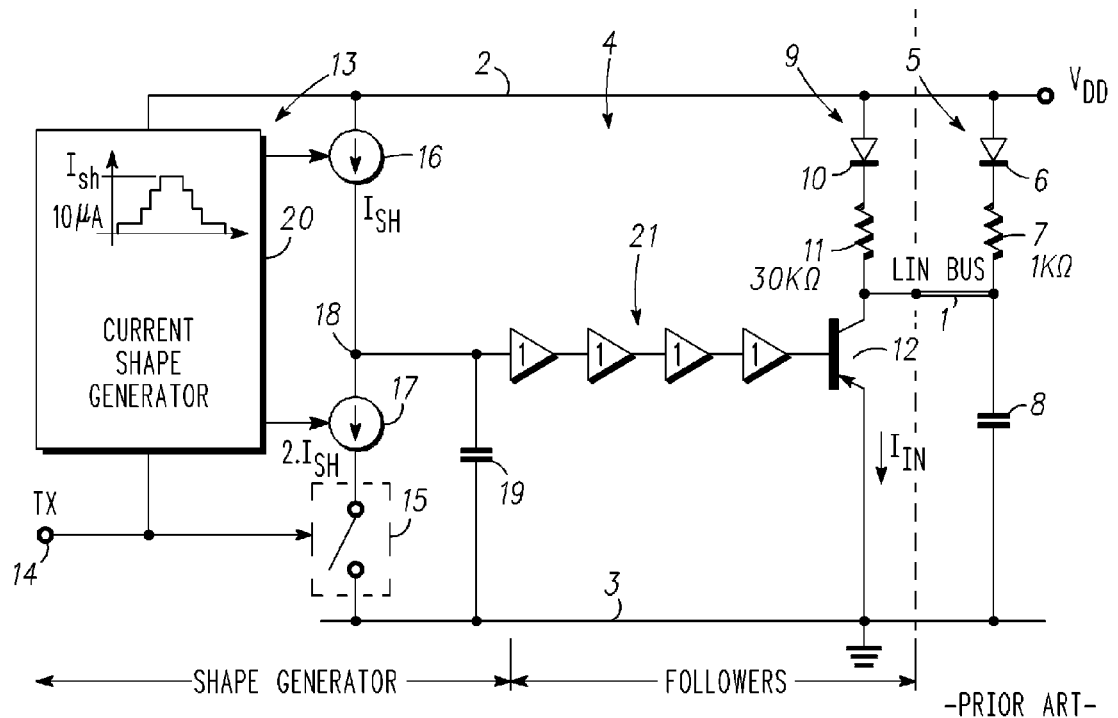
FIG. 1 is a block schematic diagram of a known signal generator in a transmitter for a communication bus line.

FIG. 1 shows a known communication system, comprising a LIN communication bus line 1, a power supply line 2, and a ground line 3 enabling communication between a transmitter node 4 and a receiver node 5. The receiver node 5 is shown schematically as comprising a diode 6 connected to the positive supply line 2, a resistor 7 connected in series with the negative pole of the diode 6, and a capacitor 8 connected between the other pole of the resistor 7 and the ground line 3, the LIN bus being a single conductor connected to the junction between the resistor 7 and the capacitor 8. It will be appreciated that the receiver node 5 is in practice associated with elements (not shown) such as signal processors and actuators for exploiting the received signals. The communication system comprising the lines 1, 2 and 3 and the transmitter node 4 and receiver node 5 may be installed in a vehicle or may be included in industrial applications, for example. It will also be appreciated that the system may be adapted to other communication standards, such as the CAN standard. According to the LIN standard, as shown, the physical LIN bus medium is a single wire connected via the termination resistor (pull-up) 7 to a positive voltage level, which, in automotive applications, will typically be the positive battery node. The idle state (communication pulse de-asserted) is high or recessive and the active state (communication pulse asserted) is low or dominant.

The transmitter node comprises an output stage 9 comprising a diode 10 whose positive pole is connected to the positive voltage supply line 2 and whose negative pole is connected to one terminal of a resistor 11, the emitter and collector terminals of a PNP transistor 12 being connected in series between the other terminal of the resistor 11 and the ground line 3.

The signal generator also comprises an input stage 13. A rectangular pulse data signal is applied to an input terminal 14, which is connected to control the opening and closing of a switch 15 connected to the ground line 3. A first current source 16 is connected in series with a second current source 17 through the switch 15 to ground. The connection 18 between the current sources 16 and 17 is connected to one pole of a capacitor 19 whose other pole is connected to the ground line 3. A current shape generator 20 receives a triggering input from the data signal input terminal 14, and controls the currents passed by the current sources 16 and 17, so that the currents change step-wise as indicated schematically. The current passed by the source 17 when the switch 15 is closed is $2 \cdot I_{SH}$, where $I_{SH}$ is the current passed by the current source 16.

In operation, the capacitor is charged to the voltage of the supply line 2 while the input signal at the terminal 14 is de-asserted. When the input signal at the terminal 14 is asserted, the switch 15 is closed and the net current $I_{SH}$ supplied by the current sources 16 and 17 increases step-wise to discharge the capacitor 19, the voltage-across the capacitor 19 decreasing as a function of the integral of the current $I_{SH}$. At the falling edge of the input pulse, the switch 15 is opened, and the net current flowing to the capacitor 19, from the current source 16 alone, is inverted and increases step-wise until the capacitor is fully charged.

In practice, the order of magnitude of the current $I_{SH}$ is low, typically 10 micro amps maximum, for example, and due to this high impedance of the input stage, several follower stages 21 are required. The follower stages 21 apply a current proportional to the voltage across the capacitor 19 to the base of the transistor 12, so as to apply the output signal to the LIN bus 1.

The use of the digital current shape generator 20 enables different shapes of the rising and falling edges of the signal applied to the LIN bus 1 to be synthesised. The signal generator therefore enables the corners of the rectangular input pulse to be rounded. However, the step-wise nature of the charging current of the capacitor 19 introduces high rates of change of the charging current with time and introduces harmonics of the base frequency of the pulse edge on the LIN bus 1. Also, the current shape generator 20 is a relatively complex circuit, typically including several voltage comparators. Moreover, the current sources 16 and 17 are exposed to the full range of voltages across the capacitor 19, increasing the semiconductor area of the elements required to withstand the high voltages.

Figure 2:
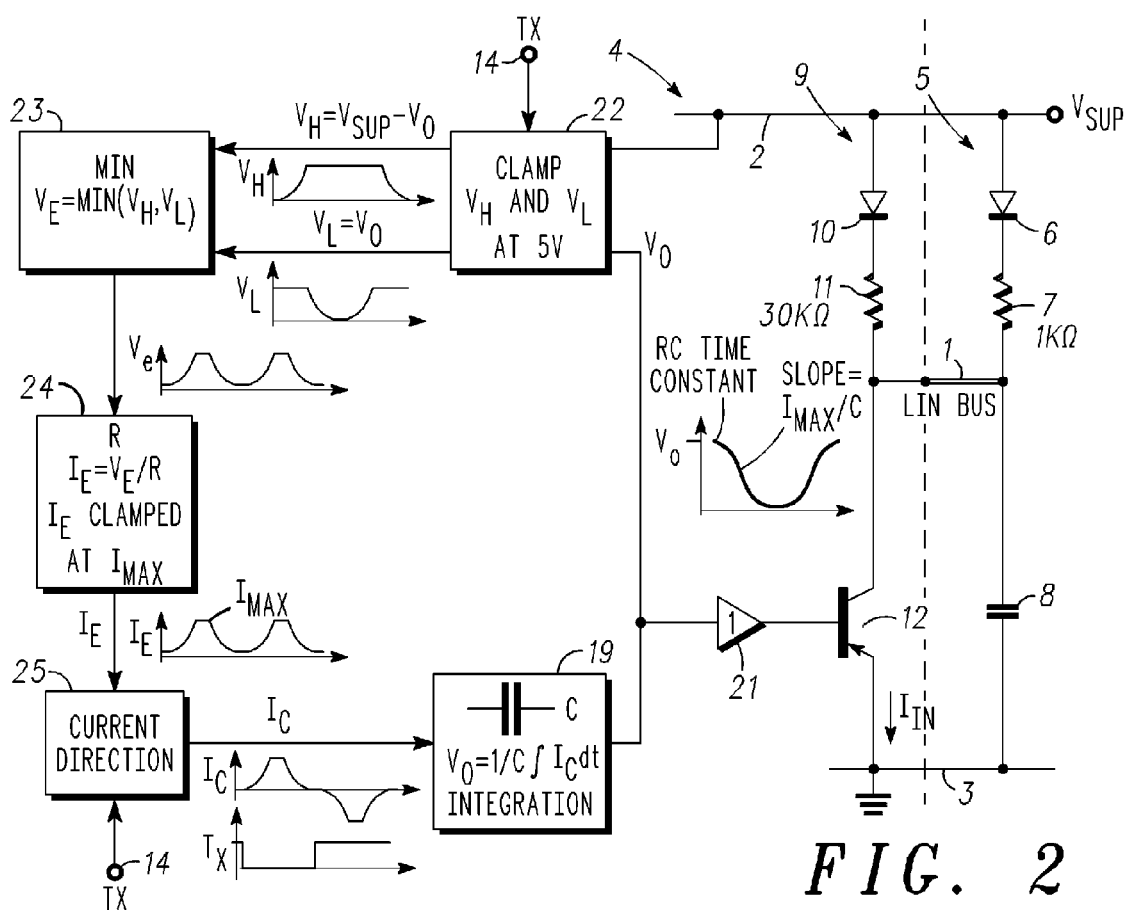
FIG. 2 is a block schematic diagram of a signal generator in a transmitter for a communication bus line, in accordance with one embodiment of the present invention, given by way of example.

FIG. 2 shows a signal generator in a transmitter in accordance with one embodiment of the present invention. The receiver node is again shown at 5 and the transmitter node at 4, with an output stage 9. A single follower stage 21 supplies the base of the transistor 12 of the output stage 9 with a current that is proportional to the voltage across the capacitor 19.

The voltage across the capacitor 19 is also supplied to a voltage generator 22 in a feedback loop. The voltage generator 22 produces a first voltage $V_L$ that is equal to the voltage $V_O$ across the capacitor 19 up to a clamp value, of 5 volts in this example, and a second voltage $V_H$ that is equal to the supply voltage $V_{SUP}$ minus the voltage $V_O$ across the capacitor 19, the voltage $V_H$ being also limited to the same clamp value. A selection circuit 23 produces a feedback voltage $V_E$ by selecting the lower of the two values $V_L$ or $V_H$. The feedback voltage $V_E$ is applied across a resistor R in a feedback current generator so as to produce a feedback current $I_E$ which is equal to $V_E/R$, the feedback current $I_E$ being limited to a clamp value $I_{MAX}$. The feedback current $I_E$ is applied to a charging current generator 25 that selectively inverts the feedback current $I_E$ to produce a charging current $I_C$ that is applied to the capacitor 19. The input signal is applied to trigger the voltage generator 22 and pilot the charging current generator 25.

The voltage generator 22, selection circuit 23, feedback current generator 24 and charging current generator 25 constitute a feedback loop. In operation, at the rising edge of the rectangular data pulse applied to the input terminal 14, the voltage across the capacitor 19, initially at the supply voltage $V_{SUP}$ is applied to the voltage generator 22. The voltage $V_H$ is initially smaller than the voltage $V_L$ and is selected by the selection circuit 23. The feedback voltage $V_E$ applied to the resistor R in the feedback current generator 24 produces a feedback current $I_E$ that is applied by the charging current generator 25 to the capacitor 19 in a direction so as to reduce the charge of the capacitor and hence its voltage $V_O$. Accordingly, the voltages $V_H$ and $V_E$ increase exponentially until the damp voltage of the generator 22 is reached. The feedback $V_E$ and the feedback current $I_E$ are then maintained at constant values, so that the voltage $V_O$ continues decreasing but linearly with time. When the voltage $V_L$ becomes smaller than the voltage $V_H$, the selection circuit 23 selects the voltage $V_L$. The voltage $V_E$ then decreases exponentially with time, so that the feedback current $I_E$ also decreases exponentially with time, and the voltage $V_O$ across the capacitor 19 changes progressively more and more slowly.

This half cycle is then repeated at the falling edge of the input pulse, with the charging current $I_C$ inverted by the inverter 25, so that the voltage $V_O$ across the capacitor 19 progressively approaches the voltage $V_{SUP}$.

Figure 3:
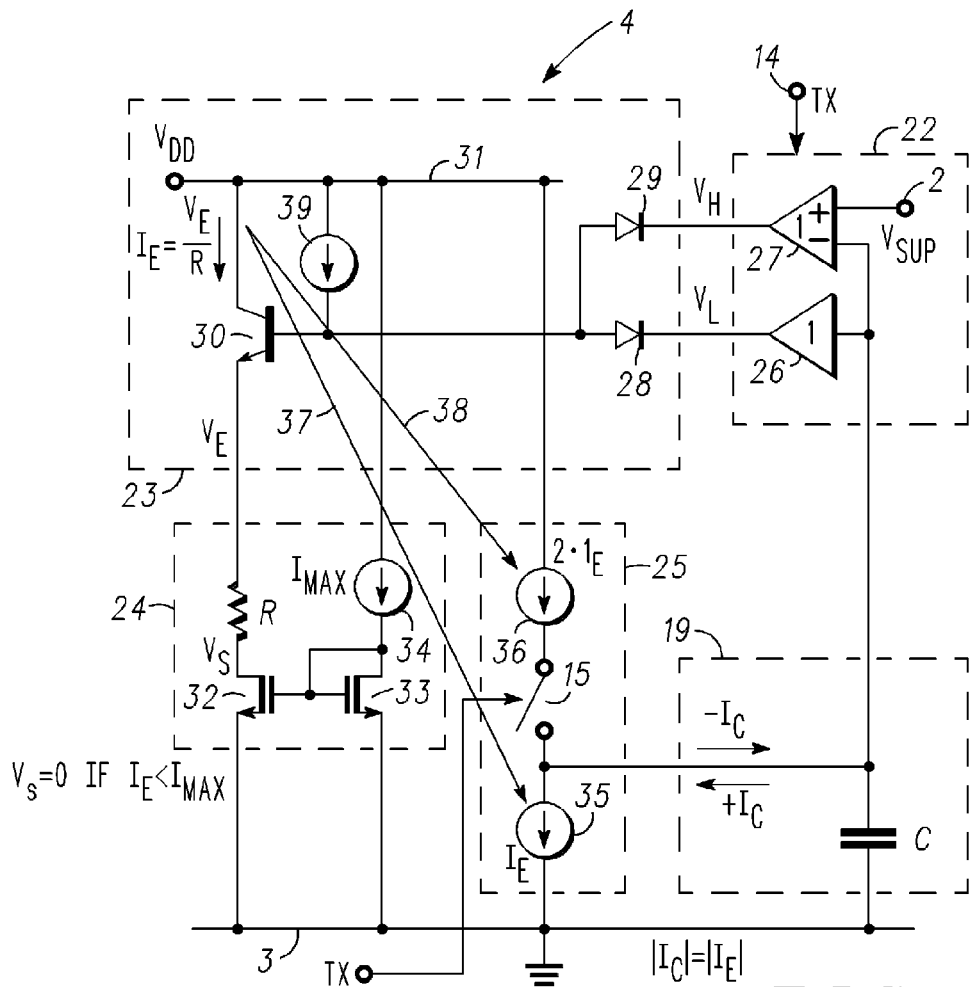
FIG. 3 is a more detailed schematic diagram of the signal generator of FIG. 2.

A preferred embodiment of the signal generator shown in FIG. 2 is illustrated in FIG. 3. The voltage generator 22 comprises a first voltage generator element 26, whose input is connected to receive the $V_O$ voltage across the capacitor 19 and a second voltage generator element 27 having an inverted input connected to receive the voltage $V_O$ and a direct input connected to receive the supply voltage $V_{SUP}$. The output of the first generator element 26 produces the feedback voltage $V_L$ and the output of the second generator element 27 produces the feedback voltage $V_H$.

The selection circuit 23 comprises a pair of diodes 28 and 29 connected respectively to receive the voltages $V_L$ and $V_H$ on their negative poles, the positive poles being connected to the base of a transistor 30. The collector of the transistor 30 is connected to an internal power supply line 31 at a substantially lower voltage than the LIN bus power supply line 2. A current generator 39 is connected between the supply line 31 and the base of the transistor 30. The emitter of the transistor 30 is connected to one terminal of the resistor R of the feedback current generator 24.

The feedback current generator 24 also comprises a first field effect transistor ('FET') 32 whose drain is connected to the other terminal of the Resistor, and whose source is connected to the ground line 3. The gate of the FET 32 is connected to the gate of a further FET 32, whose source is also connected to the ground line 3 and whose drain is shorted to its gate and is also connected through a current generator 34 to the voltage supply line 31.

The charging current generator and inverter 25 comprises first and second current mirrors 35 and 36 that are driven by the current $I_E$ in the transistor 30 and the resistor R as indicated by the arrows 37 and 38, the current flowing in the mirror 35 being equal to $I_E$ and the current generated in the mirror 36 being $2.I_E$. The current mirror 35 is connected to the capacitor 19 directly and the mirror 36 is connected to the capacitor 19 through the switch 15.

In operation, the diodes 28 and 29 select the lower of the voltages $V_L$ and $V_H$ at the outputs of the voltage generator elements 26 and 27. As long as the selected voltage is positive, it is applied across the resistor R and the FET 32, the FET 33 and current generator 34 serving to clamp the feedback current $I_E$ at a maximum value $I_{MAX}$. The operation of the switch 15 serves to select the inversion or not of the charging current $I_C$ applied to the capacitor 19. A starting current for the transistor 30 is provided by the current generator 39 connected between the voltage supply line 31 and the base of the transistor 30.

Figure 4:
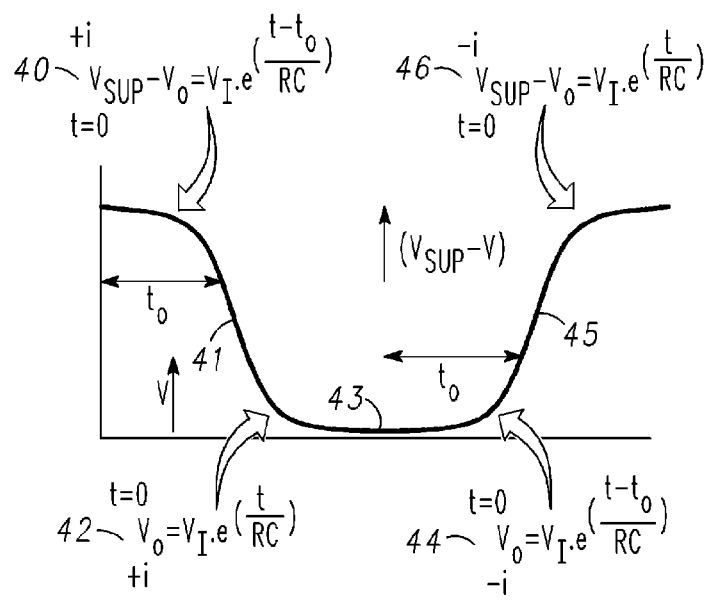
FIG. 4 is a diagram illustrating the variation with time of an output voltage of the signal generator of FIGS. 2 and 3.
Figure 5:
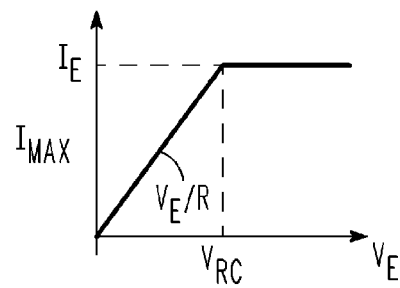
FIG. 5 is a diagram illustrating the variation of a feedback current appearing in operation of the signal generator of FIGS. 2 and 3, as a function of a feedback voltage.

Referring now to FIGS. 4 and 5, it will be seen that, during a first phase 40, starting at the rising edge of the data signal at the terminal 14, the voltage $V_O$ decreases as an exponential function of time, its rate of decrease progressively increasing. During a second phase 41, the voltage $V_O$ decreases linearly with time, and during a third phase 42, the voltage $V_O$ continues to decrease as an exponential function of time, but with its rate of change progressively decreasing. The voltage $V_O$ subsequently remains constant during a fourth phase 43. It will be appreciated that, throughout the three phases 40 to 42, the feedback current $I_E$ and the charging current $I_C$ have continuous magnitudes that are progressive functions of the $V_O$, so that the rate of change of the $V_O$ never exceeds maximum values as would be the case with step-wise, discontinuous changes in the charging current. Subsequent phases 44, 45 and 46 mirror the phases 42, 41 and 40 with the current inverted so that the capacitor is progressively charged up to the $V_{SUP}$ in response to the falling edge of the data signal at the terminal 14.

Figure 6:
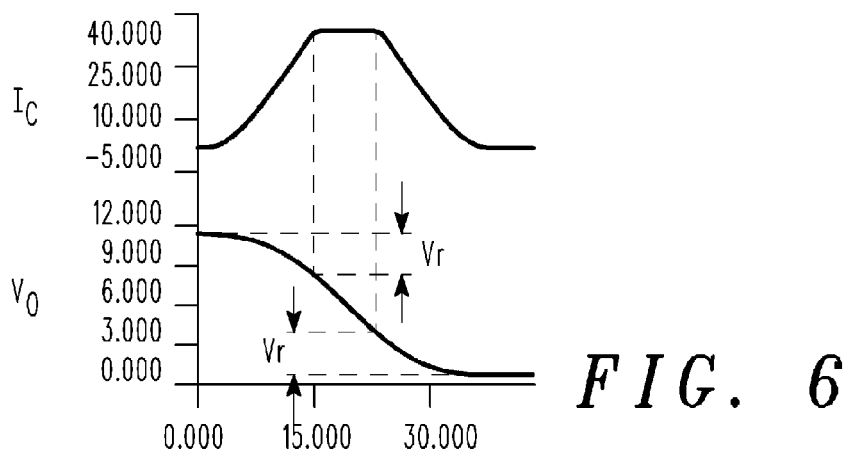
FIG. 6 is a diagram illustrating the variations with time of a charging current and the output voltage of the signal generator of FIGS. 2 and 3.

The charging current is proportional to the feedback voltage $V_E$ from the selection circuit 23 divided by the value of the resistor R until the current reaches the maximum value $I_{MAX}$ defined by the generator 34 and FET 33. FIG. 6 shows the resulting values of the charging current $I_C$ and the output $V_O$ as functions of time. This half cycle of variation of the output voltage corresponds with a close approximation to a pure sinusoidal half cycle, so that electromagnetic emissions on the LIN bus 1 are limited to a single base frequency with little contribution from harmonics of that base frequency. The base frequency is a relatively low frequency, which can readily be chosen to be compatible with acceptable standards.

Figure 7:
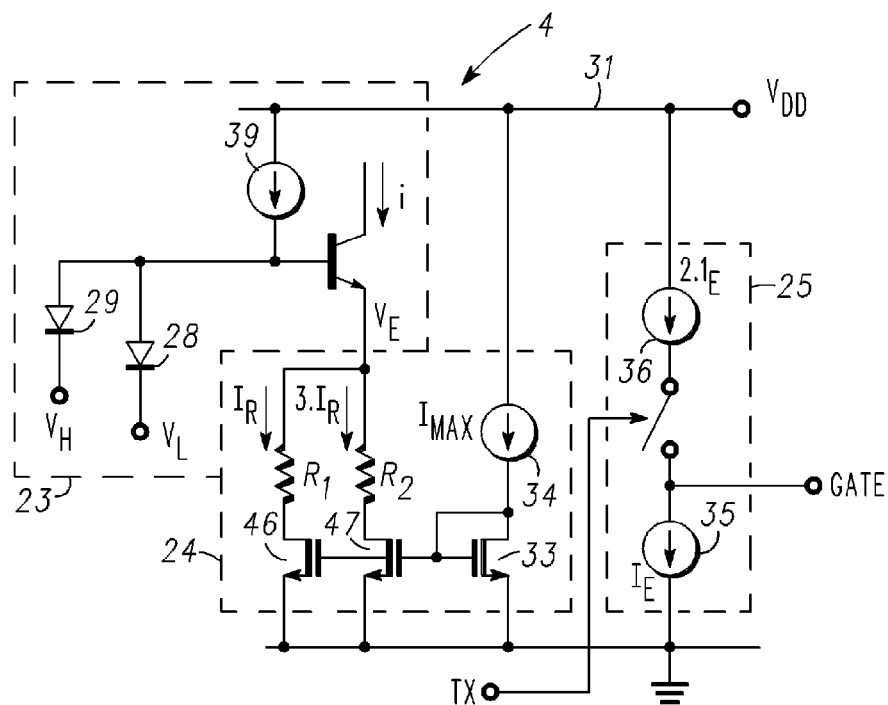
FIG. 7 is a schematic diagram of another embodiment of a signal generator in a transmitter for a communication bus line in accordance with the present invention.
Figure 8:
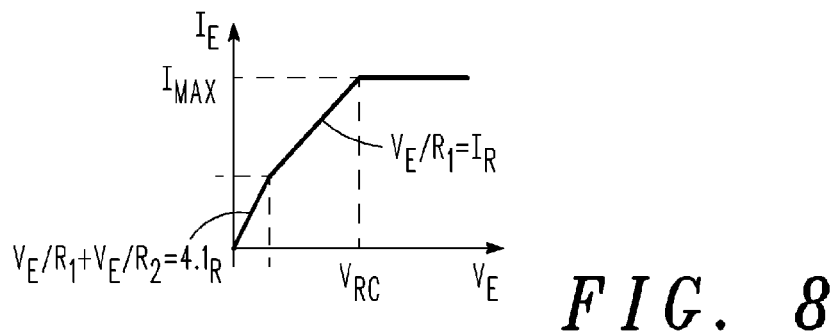
FIG. 8 is a diagram similar to FIG. 5 for the signal generator of FIG. 7.

FIG. 7 shows a variant of the embodiment of the invention shown in FIG. 3 in which the resistor R is replaced by resistors $R_1$ and $R_2$ in parallel and the FET 32 is replaced by FETS 46 and 47 in series respectively with the resistors $R_1$ and $R_2$. The values of the resistors $R_1$ and $R_2$ are chosen so that the application of a voltage $V_E$ to the resistors $R_1$ and $R_2$ with the FETS 46 and 47 conducting will divide the feedback current $I_E$ so that a part $I_R$ of the feedback current $I_E$ flows through the resistor $R_1$ and a part equal to three times $I_R$ flows through the resistor $R_2$. The variation of the overall feedback current $I_E$ with the voltage $V_E$ is shown in FIG. 8, which is similar to the diagram of FIG. 5. The sum of the part currents in the $R_1$ and $R_2$ is equal to four times $I_R$ until the gate-source voltage of the FET 47 reaches that of the FET 33 and the feedback current $I_E$ then reduces to the part current $I_R$ until the part current $I_R$ reaches the value $I_{MAX}$. The resulting feedback current $I_E$ remains a continuous function of the feedback $V_E$ but its rate of change is initially faster than in the embodiment of FIGS. 2 and 3 and subsequently slower. It is found that this variant gives an even closer approximation to a sinusoidal half cycle of the rising and falling edges of the $V_O$ with consequently even less emissions of harmonics of the base frequency.

The invention claimed is:

1. A transmitter for a controlled-shape switched signal on a communication line comprising signal generator means including capacitor means and signal producing means responsive to a capacitor voltage across said capacitor means for applying said switched signal to said line, and charging means responsive to an input signal for supplying a charging current to said capacitor means so as to define an edge of said switched signal, characterized in that said charging means comprises feedback loop means responsive to said capacitor voltage for generating a feedback current having a continuous magnitude that is a progressive function of said capacitor voltage, said charging current being a function of said feedback current so that the rate of change of said capacitor voltage is a continuous function of time, said feedback loop means comprises first and second feedback loop elements for generating first and second feedback voltages whose magnitudes are respective functions of said capacitor voltage and selection means for generating said feedback current first as a function of a selected one of said first and second feedback voltages and subsequently as a function of the other of said feedback voltages.

2. A transmitter as claimed in claim 1, wherein one of said first and second feedback voltages is a rising function of said capacitor voltage and the other is a falling function of said capacitor voltage, so that the rate of change of said feedback current increases with time while said one of said first and second feedback voltages is selected and decreases with time while said other of said first and second feedback voltages is selected.

3. A transmitter as claimed in claim 1, wherein said feedback loop means comprises clamp means for maintaining said feedback current at a limit value such that said charging current and said capacitor voltage vary substantially as linear functions of time for a part of said edge of said switched signal.

4. A transmitter as claimed in claim 1, wherein said selection means is responsive to the relative magnitudes of said first and second feedback voltages to select one of said first and second feedback voltages.

5. A transmitter as claimed in claim 1, wherein said rate of change of said feedback current is arranged to be a function of said capacitor voltage such that said capacitor voltage varies substantially as an exponential function of time, at least for a part of said edge of said switched signal.

6. A transmitter as claimed in claim 1, wherein said charging means comprises resistive means for receiving a voltage that is a function of said capacitor voltage for generating said feedback current.

7. A transmitter as claimed in claim 6, wherein said charging means comprises means for modifying said resistive means so as to modify the rates of change of said feedback current and said charging current.

8. A transmitter as claimed in claim 6, wherein said capacitor voltage varies substantially as a sinusoidal half-cycle having a single frequency to define said edge of said switched signal.

9. A transmitter as claimed in claim 1, wherein said capacitor voltage varies substantially as a sinusoidal half-cycle having a single frequency to define said edge of said switched signal.

10. A transmitter as claimed in claim 1, wherein said charging means is selectively responsive to said input signal for supplying a positive or a negative charging current to said capacitor means, whereby to generate a rising edge or a falling edge of said switched signal.

11. A transmitter as claimed in claim 1, wherein said charging means comprises resistive means for receiving a voltage that is a function of said capacitor voltage for generating said feedback current.

12. A transmitter as claimed in claim 1, wherein said capacitor voltage varies substantially as a sinusoidal half-cycle having a single frequency to define said edge of said switched signal.

* * * * *